United States Patent
Rogers et al.

(10) Patent No.: US 11,013,138 B2
(45) Date of Patent: May 18, 2021

(54) CABLE MANAGEMENT ASSEMBLY FOR MANAGING CABLES OF RACK-MOUNTED COMPUTERS

(71) Applicant: International Business Machines Corporation, Armonk, NY (US)

(72) Inventors: Justin C. Rogers, Rochester, MN (US); Sandra J. Shirk/Heath, Rochester, MN (US); Kenneth E. Lubahn, Oronoco, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/407,659

(22) Filed: May 9, 2019

(65) Prior Publication Data
US 2020/0359520 A1 Nov. 12, 2020

(51) Int. Cl.
*H05K 7/14* (2006.01)
*H05K 7/18* (2006.01)

(52) U.S. Cl.
CPC ......... *H05K 7/1491* (2013.01); *H05K 7/1401* (2013.01); *H05K 7/183* (2013.01)

(58) Field of Classification Search
CPC ..... H05K 7/1491; H05K 7/1401; H05K 7/183
See application file for complete search history.

(56) References Cited

U.S. PATENT DOCUMENTS

| 8,526,774 | B2 * | 9/2013 | Krampotich | G02B 6/4453 |
| | | | | 385/135 |
| 9,974,205 | B1 | 5/2018 | Clark et al. | |
| 10,172,250 | B2 | 1/2019 | Babcock et al. | |
| 10,539,757 | B2 * | 1/2020 | Ruiz | G02B 6/3897 |
| 2005/0025444 | A1 * | 2/2005 | Barnes | G02B 6/4439 |
| | | | | 385/135 |
| 2018/0092238 | A1 | 3/2018 | Adrian | |
| 2018/0192540 | A1 | 7/2018 | Kumar et al. | |
| 2019/0008069 | A1 * | 1/2019 | Chen | H05K 7/1491 |

OTHER PUBLICATIONS

Anonymous, *Cable Raceway System for Concurrent Maintenance of IT Equipment*, an IP.com Prior Art Database Technical Disclosure, IP.com No. IPCOM000257374D, IP.com Electronic Publication Date: Feb. 6, 2019, 7 pages.

* cited by examiner

*Primary Examiner* — James Wu
*Assistant Examiner* — Hung Q Dang
(74) *Attorney, Agent, or Firm* — Nathan Rau

(57) ABSTRACT

A cable management assembly for managing cables of rack-mounted computers may include: a base member selectively attachable to a structural member of a computer rack; and a sliding member comprising a cable retention area, wherein the sliding member is configured for connection to the base member by one or more mating connection components, wherein the one or more mating connection components allow for a limited degree of movement of the sliding member relative to the base member.

17 Claims, 5 Drawing Sheets

CABLE MANAGEMENT ASSEMBLY FOR MANAGING CABLES OF RACK-MOUNTED COMPUTERS

BACKGROUND

Field of the Invention

The field of the invention is computer cable management, or, more specifically, managing cables of rack-mounted computers.

Description Of Related Art

Computer systems are sometimes housed in computer racks, in which multiple computer chassis are connected to vertical structural members of a computer rack. Computers installed in the racks communicate with each other via cables. An organized arrangement of cables makes it easier for a technician to identify a particular cable at a later time (e.g., to replace the cable). Additionally, an organized arrangement of cables in a computer rack can provide better airflow pathways through the computer rack than a haphazard arrangement of cables. Furthermore, cables should be organized to ensure that cable lengths do not extend past a length where signals may degrade.

SUMMARY

A cable management assembly for managing cables of rack-mounted computers may include a base member selectively attachable to a structural member of a computer rack; and a sliding member comprising a cable retention area, wherein the sliding member is configured for connection to the base member by one or more mating connection components, wherein the one or more mating connection components allow for a limited degree of movement of the sliding member relative to the base member.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION

Figure 1:
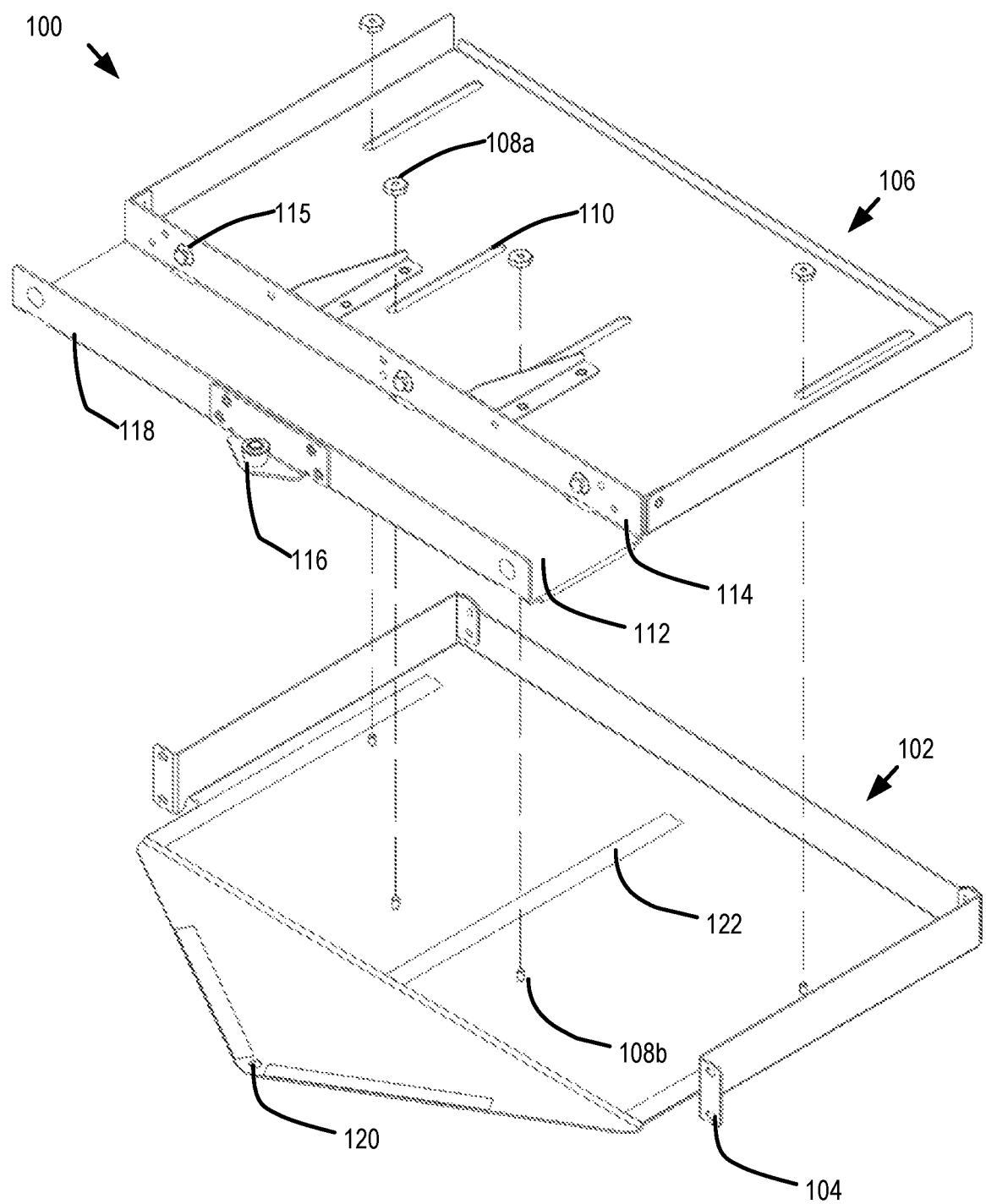
FIG. 1 is an exploded view of a cable management assembly for managing cables of rack-mounted computers.

FIG. 1 shows an exploded view of an example cable management assembly 100 for managing cables of rack-mounted computers. The example cable management assembly 100 includes a base member 102 selectively attachable to a structural member 202 of computer rack 200. The base member 102 includes mounting holes 104 to facilitate the attachment of the base member 102 to the structural member of the computer rack. The mounting holes 104 may be sized and spaced based on the EIA-310 standard for computer racks to allow the base member 102 to be mounted in the computer rack. Thus, the cable management assembly 100 can be used to retain and organize cables for any rack mounted computer.

Although mounting hole sizes and placements are standardized for computer racks, there is no standardized approach for cable management components on the computers themselves. If any cable management components are included on a computer chassis, they may vary from computer to computer, making it difficult to consistently or cleanly organize the cables connecting various computers. By using multiple cable management assemblies 100, a computer rack can implement an organized and consistent arrangement of cables regardless of the rack used.

The cable management assembly 100 may also include a sliding member 106. The sliding member 106 is configured for connection to the base member 102 by one or more mating connection components 108a/b, wherein the one or more mating connection 108a/b components allow for a limited degree of movement of the sliding member 106 relative to the base member 102. The mating connection component 108a may comprise a nut, screw, or other component capable of mating with a connection component 108b. The mating component 108b may comprise a threaded post or other mating component fixed to the base member 102. The mating component 108b may also comprise a screw, bold, nut, or other mating component inserted through a hole in the base of the base member 102.

For example, the mating connection component 108a may comprise a shoulder nut or shoulder screw comprising a head with a circumference greater than a width of a guiding hole 110 and a shoulder circumference less than the width of the guiding hole 110. This allows for the sliding member 106 to slide in axis relative to the base member 102 until the mating connection component 108a/b catches an endpoint of the guiding hole 110, thereby providing for a limited degree of movement of the sliding member 106 relative to the base member 102.

The sliding member 106 also comprises a cable retention area 112. The cable retention area 112 serves to retain computer cables for service or organization. The cable retention area 112 comprises a fraction of the total depth of the sliding member 106, allowing for easier access to retained cables. The cable retention area 112 may comprise one or more mounting points 115 for mounting clamps, bracket, clips, or other mechanisms for cable retention and organization to an interior surface 114 (and/or a reverse side of the exterior surface 118) of the cable retention area 112.

The cable retention area 112 is open on opposing sides to allow for cables to be inserted into one side, passed through the cable retention area, and exited from the opposing side. For example, cables from a computer mounted in a rack position above the cable management assembly 100 may pass through the cable retention area 112 for connection to a computer mounted in a rack position below the cable management assembly 100. By limiting the amount of space used for cable retention to the cable retention area 112, the remaining open space of the cable management assembly 100 provides for increased air flow and cooling for adjacently mounted computers.

A detent 116 may be mounted or otherwise affixed to an exterior surface 118 of the sliding member 106 (e.g., of the cable retention area 112). The detent 116 may lock into a retention hole 120 of the base member 102 to prevent movement of the sliding member 102. The detent 116 may include a spring loaded plunger, a pin, a retention screw, or other detent 116 as can be appreciated.

The base member 102 and sliding member 106 may be composed of metal, plastic, or any substantially rigid material. To reduce any creation of particulate matter or debris by the movement of the sliding member 106, the base member 102 and/or the sliding member 106 may comprise a friction reducing surface 122 to minimize physical contact between the base member 102 and sliding member 106.

Figure 2:
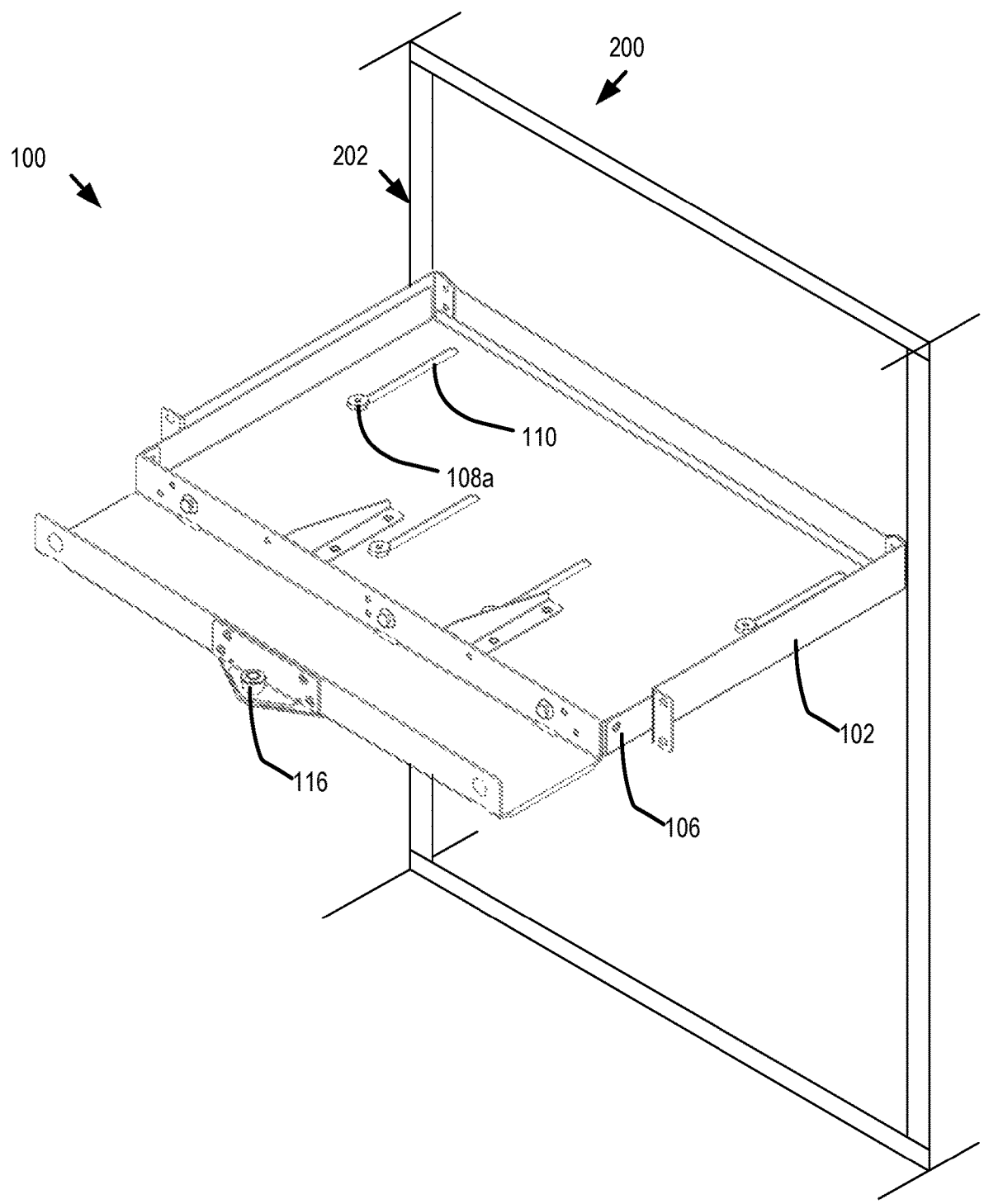
FIG. 2 is an assembled view of a cable management assembly for managing cables of rack-mounted computers in a closed or "operational" position.

FIG. 2 shows an assembled view of an example cable management assembly 100 for managing cables of rack-mounted computers. Here, the sliding member 106 is nested within a frame of the base member 102. Mating connection components 108a are mated to mating connection components 108b (not shown) and inserted through guiding holes 110 to prevent movement of the sliding member 106 perpendicular to the base member 102. The detent 116 is inserted into the retention hole 120 (not shown), thereby locking or fixing the sliding member 106 in a closed or "operational" position relative to the base member 102. In a preferred embodiment, the height of the cable management assembly 100 (e.g., the combined height of the base member 102 and sliding member 106 when the sliding member 106 is nested to and connected with the base member 102) is approximately one rack unit (1.75 inches). Thus, the cable management assembly 100 may be mounted within a standard computer rack and only occupy one rack unit of space for each mounted cable management assembly 100.

Figure 3:
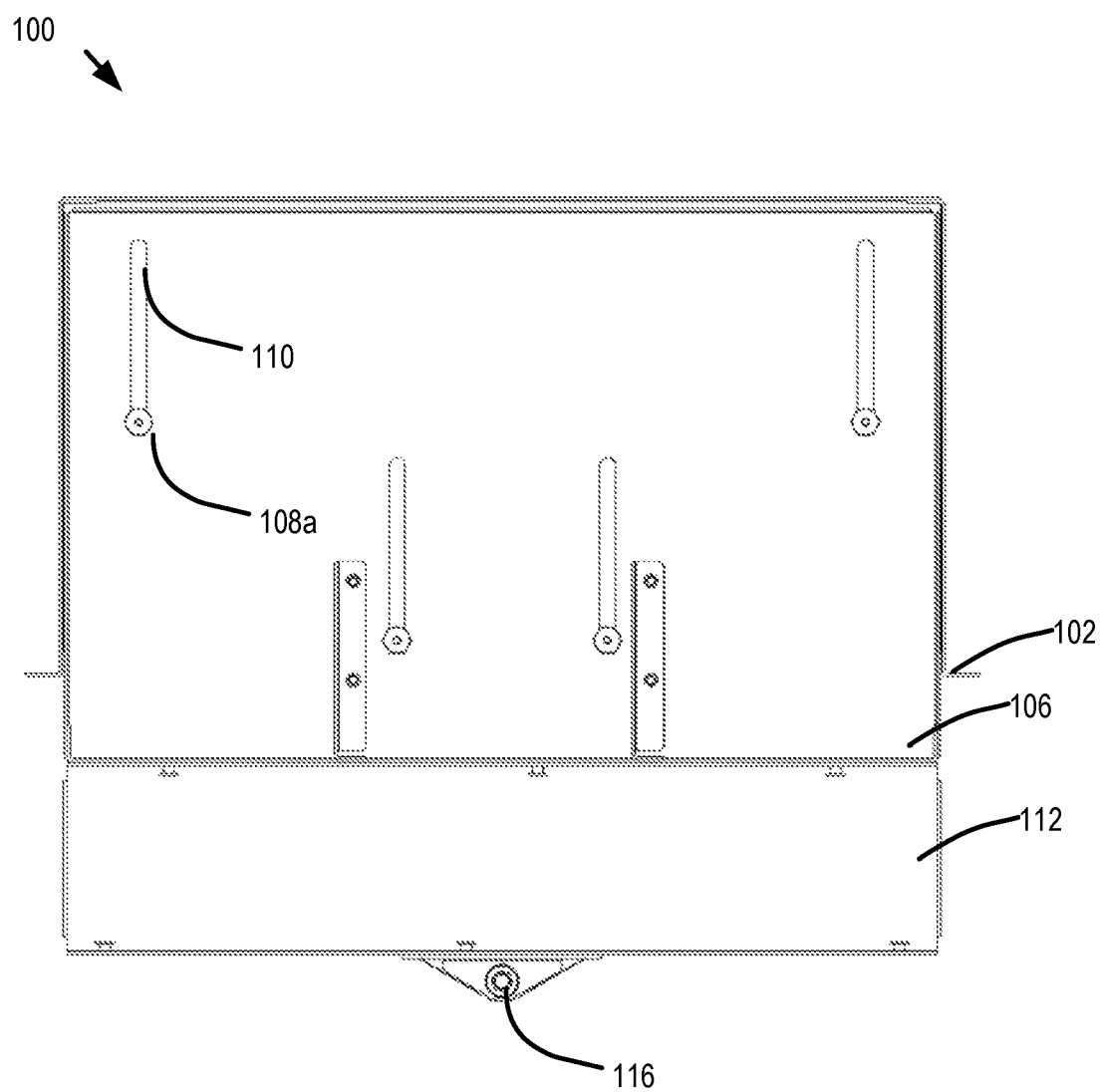
FIG. 3 is a top view of a cable management assembly for managing cables of rack-mounted computers in an open or "service" position.

FIG. 3 shows a top view of an example cable management assembly 100 for managing cables of rack-mounted computers. Here, the sliding member 106 is nested within a frame of the base member 102. Mating connection components 108a are mated to mating connection components 108b (not shown) and inserted through guiding holes 110 to prevent movement of the sliding member 106 perpendicular to the base member 102. The detent 116 is inserted into the retention hole 120 (not shown), thereby locking or fixing the sliding member 106 in a closed or "operational" position relative to the base member 102. When in the closed position, access to cables retained in the cable retention area 112 may be restricted.

Figure 4:
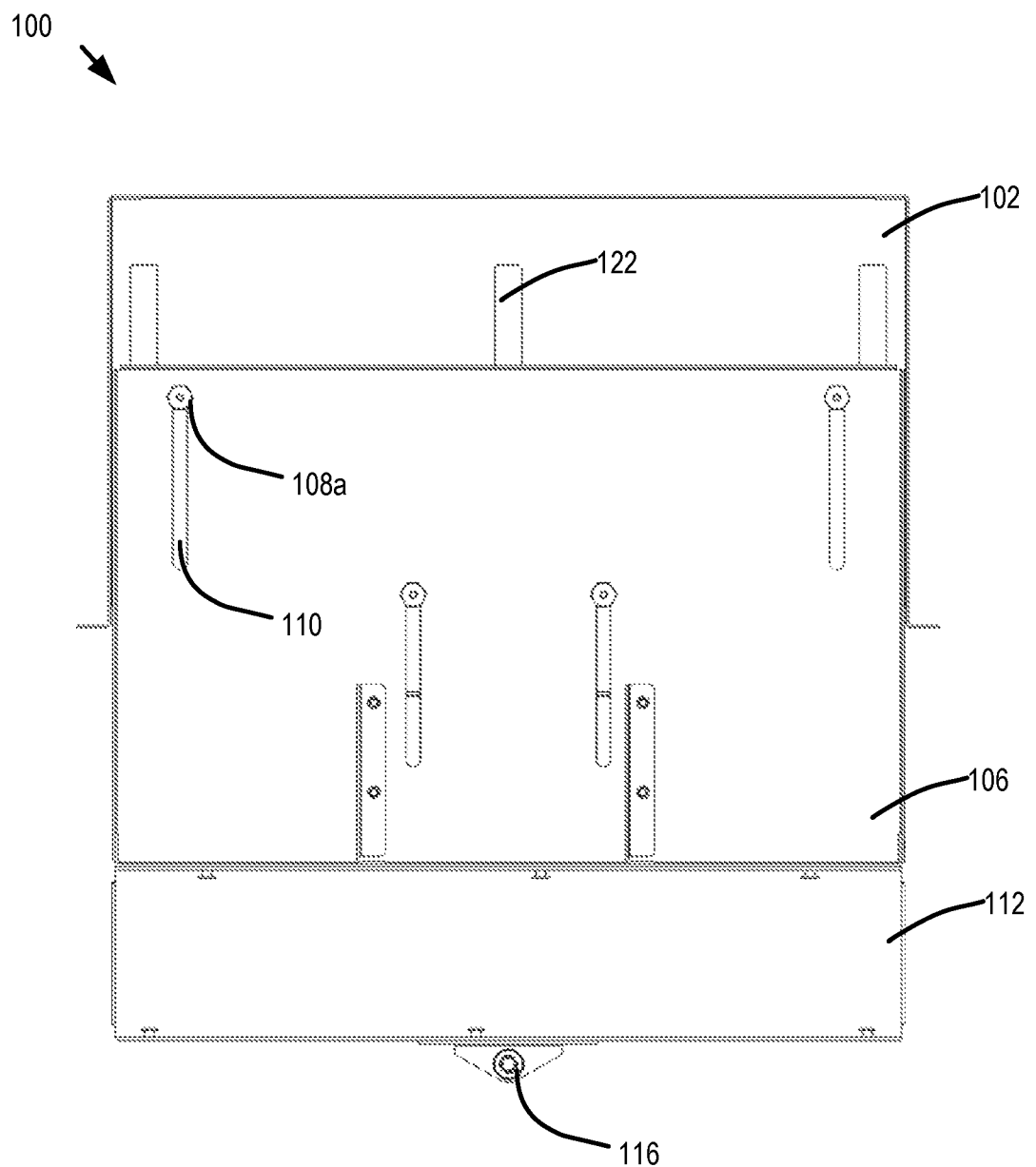
FIG. 4 is a top view of a cable management assembly for managing cables of rack-mounted computers.

FIG. 4 shows a top view of an example cable management assembly 100 for managing cables of rack-mounted computers. Here, the mating connection components 108a are caught against an end of the guiding holes 110, preventing further movement of the sliding member 106 parallel to the base member 102. As the sliding member 106 has moved relative to the base member 102 from the closed position, the detent 116 is not inserted into the retention hole 120 (not shown). This allows for a range of movement of the sliding member 106 as restricted by the mating connection components 108a and the guiding holes 110. Such movement may be facilitated by a friction reducing surface 122 affixed to the base member 102. Here, the cable management assembly 100 is considered in an open or "service" position, as any cables retained by the cable retention area 112 may be accessed by service personnel or other persons through the top (e.g., open) portion of the cable retention area.

Figure 5:
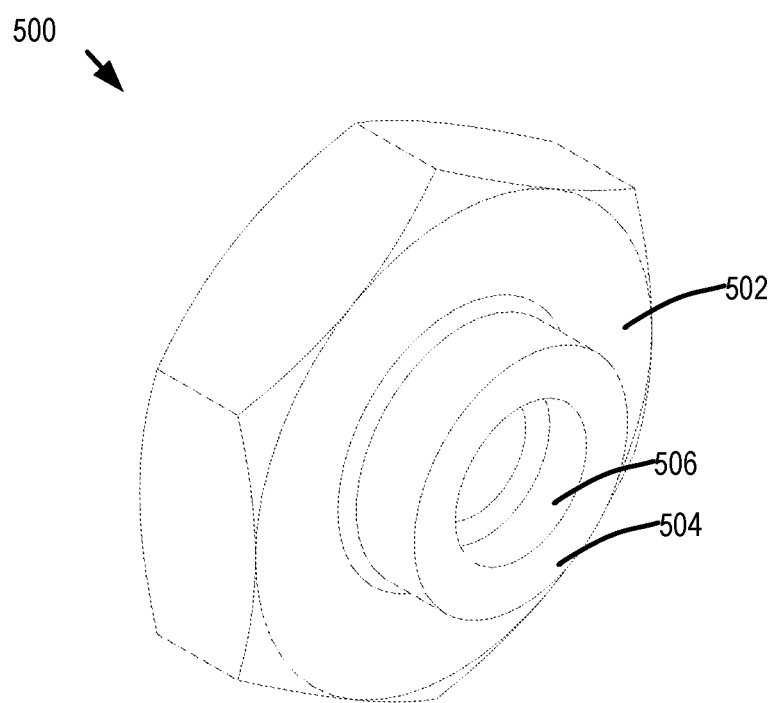
FIG. 5 a view of an example shoulder nut of a cable management assembly for managing cables of rack-mounted computers.

FIG. 5 is a view of an example shoulder nut 500 for managing cables of rack-mounted computers. The shoulder nut 500 may be used as a mating connection component 108a to connect a sliding member 106 of a cable management assembly 100 to a base member 102 of the cable management assembly. The shoulder nut 500 includes a head component 502 having a circumference greater than a width of a guiding hole 110 of a sliding member 106. This prevents movement of the sliding member 106 perpendicular to the base member 102. The head component 502 of the shoulder nut 500 includes flattened edges to facilitate a rotation of the shoulder nut 500 using a wrench, ratchet, pliers, or other tool.

The shoulder nut 500 also includes a shoulder component 504. The shoulder component 504 has a circumference less than (e.g., approximately equal to) the width of the guiding hole 110. This allows the sliding member 106 to move in a single axis parallel to the base member 102. The range of motion of the sliding member 106 is dictated by the shoulder component 504 catching or making contact with an end of the guiding hole 110. The shoulder nut 500 further includes a threaded interior 506 allowing the shoulder nut to mate with a mating connection component 108b (e.g., a threaded post, a threaded bolt, a threaded screw).

In view of the explanations set forth above, readers will recognize that the benefits of a cable management assembly for managing cables of rack-mounted computers according to embodiments of the present invention include:

A cable management assembly that can be mounted to structural members of any standard computer rack. This allows for cables of any rack mounted computer to be managed and organized.

Increased air flow and cooling for computers mounted adjacent to the cable management assembly.

Efficient use of rack space by having the height of the cable management assembly to be approximately one rack unit.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A cable management assembly for managing cables of rack-mounted computers, the cable management assembly comprising:
   a base member selectively attachable to a structural member of a computer rack;
   a sliding member comprising a cable retention area, wherein the sliding member is configured for connection to the base member by one or more mating connection components, wherein the one or more mating connection components allow for a limited degree of movement of the sliding member relative to the base member, wherein the cable retention area is outside the base member and open to direct access by a user from opposing sides of the cable management assembly after the sliding member is in a closed position; and
   a single detent mounted to the sliding member and located on an exterior surface of the cable retention area configured to restrict movement of the sliding member relative to the base member, wherein the single detent is further configured to lock into a retention hole within the base member, wherein the retention hole within the base member is located beneath the single detent mounted to the sliding member when the sliding member is in the closed position.

2. The cable management assembly of claim 1, wherein a portion of one or more of the base member or the sliding member comprises a friction reducing surface.

3. The cable management assembly of claim 1, wherein the one or more mating connection components comprises a shoulder nut.

4. The cable management assembly of claim 1, wherein the detent comprises a spring loaded plunger.

5. The cable management assembly of claim 1, wherein the cable retention area comprises one or more mounting points, wherein the one or more mounting points further comprises one or more cable clamps mounted to an interior surface of the cable retention area.

6. The cable management assembly of claim 1, wherein a height of the cable management assembly is approximately one rack unit.

7. A computer rack for managing cables of rack-mounted computers, the computer rack comprising:
   a plurality of structural members configured to support a plurality of computer chassis; and
   a cable management assembly comprising:
      a base member selectively attachable to one of the plurality of structural members of the computer rack;
      a sliding member comprising a cable retention area, wherein the sliding member is configured for connection to the base member by one or more mating connection components, wherein the one or more mating connection components allow for a limited degree of movement of the sliding member relative to the base member, wherein the cable retention area is outside the base member and open to direct access by a user from opposing sides of the cable management assembly after the sliding member is in a closed position; and
      a single detent mounted to the sliding member and located on an exterior surface of the cable retention area configured to restrict movement of the sliding member relative to the base member, wherein the single detent is further configured to lock into a retention hole within the base member, wherein the retention hole within the base member is located beneath the single detent mounted to the sliding member when the sliding member is in the closed position.

8. The computer rack of claim 7, wherein a portion of one or more of the base member or the sliding member comprises a friction reducing surface.

9. The computer rack of claim 7, wherein the one or more mating connection components comprises a shoulder nut.

10. The computer rack of claim 7, wherein the detent comprises a spring loaded plunger.

11. The computer rack of claim 7, wherein the cable management assembly further comprises one or more cable clamps mounted to an interior surface of the cable retention area.

12. The computer rack of claim 7, wherein a height of the cable management assembly is approximately one rack unit.

13. A method managing cables of rack-mounted computers, the method comprising:
   retaining one or more cables connecting one or more devices mounted to a computer rack using a cable management assembly mounted to the computer rack, the cable management assembly comprising:
      a base member selectively attachable to a structural member of the computer rack;
      a sliding member comprising a cable retention area, wherein the sliding member is configured for connection to the base member by one or more mating connection components, wherein the one or more mating connection components allow for a limited degree of movement of the sliding member relative to the base member, wherein the cable retention area is outside the base member and open to direct access by a user from opposing sides of the cable management assembly after the sliding member is in a closed position; and
      a single detent mounted to the sliding member and located on an exterior surface of the cable retention area configured to restrict movement of the sliding member relative to the base member, wherein the single detent is further configured to lock into a retention hole within the base member, wherein the retention hole within the base member is located beneath the single detent mounted to the sliding member when the sliding member is in the closed position.

14. The method of claim 13, wherein a portion of one or more of the base member or the sliding member comprises a friction reducing surface.

15. The method of claim 13, wherein the one or more mating connection components comprises a shoulder nut.

16. The method of claim 13, wherein the detent comprises a spring loaded plunger.

17. The method of claim 13, wherein the cable management assembly further comprises one or more cable clamps mounted to an interior surface of the cable retention area.

* * * * *